(12) United States Patent
Han et al.

(10) Patent No.: US 12,717,228 B2
(45) Date of Patent: Aug. 25, 2026

(54) SEMICONDUCTOR PHOTORESIST COMPOSITION AND METHOD OF FORMING PATTERNS USING THE COMPOSITION

(71) Applicant: SAMSUNG SDI CO., LTD, Yongin-si (KR)

(72) Inventors: Seung Han, Suwon-si (KR); Sangkyun Im, Suwon-si (KR); Minyoung Lee, Suwon-si (KR); Jimin Kim, Suwon-si (KR); Yaeun Seo, Suwon-si (KR); Bukeun Oh, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 740 days.

(21) Appl. No.: 18/199,843

(22) Filed: May 19, 2023

(65) Prior Publication Data

US 2024/0027899 A1 Jan. 25, 2024

(30) Foreign Application Priority Data

Jul. 12, 2022 (KR) ........................ 10-2022-0085855

(51) Int. Cl.

| | |
|---|---|
| ***G03F 7/004*** | (2006.01) |
| ***G03F 7/11*** | (2006.01) |
| ***G03F 7/20*** | (2006.01) |

(52) U.S. Cl.

CPC .............. *G03F 7/0042* (2013.01); *G03F 7/11* (2013.01); *G03F 7/2006* (2013.01)

(58) Field of Classification Search

CPC ........ G03F 7/0042; G03F 7/11; G03F 7/2006; G03F 7/0755; G03F 7/70033; G03F 7/004; G03F 7/0048; G03F 7/2004; C07F 7/2224; H10P 76/2041

USPC ............. 430/270.1, 271.1, 272.1, 273.1, 311

See application file for complete search history.

(56) References Cited

U.S. PATENT DOCUMENTS

| | | | |
|---|---|---|---|
| 5,061,599 A | 10/1991 | Kudo et al. | |
| 6,764,552 B1 | 7/2004 | Joyce et al. | |
| 2011/0045406 A1 | 2/2011 | Keszler et al. | |
| 2020/0027899 A1* | 1/2020 | Chen | G02F 1/133371 |
| 2020/0041897 A1 | 2/2020 | Moon et al. | |
| 2021/0063871 A1 | 3/2021 | Kobayashi et al. | |
| 2021/0109442 A1 | 4/2021 | Moon et al. | |
| 2021/0262084 A1 | 8/2021 | Knisley et al. | |
| 2021/0356861 A1 | 11/2021 | Han et al. | |

(Continued)

FOREIGN PATENT DOCUMENTS

| | | |
|---|---|---|
| CN | 113655689 A | 11/2021 |
| JP | 3454505 B2 | 3/2001 |

(Continued)

OTHER PUBLICATIONS

Japanese Office Action issued in corresponding Application No. JP 2023-079117, dated Jul. 23, 2024, 6 pages.

(Continued)

*Primary Examiner* — Dale E Page
*Assistant Examiner* — Caleen O Sullivan
(74) *Attorney, Agent, or Firm* — Womble Bond Dickinson (US) LLP

(57) ABSTRACT

A semiconductor photoresist composition includes a first organometallic compound, a second organometallic compound, and a solvent. A method of forming patterns utilizing the same is provided.

24 Claims, 2 Drawing Sheets

(56) References Cited

U.S. PATENT DOCUMENTS

| | | | | |
|---|---|---|---|---|
| 2023/0266664 | A1 | 8/2023 | Hansen et al. | |
| 2025/0298311 | A1* | 9/2025 | Lim | G03F 7/0042 |
| 2025/0306456 | A1* | 10/2025 | Kang | G03F 7/0042 |

FOREIGN PATENT DOCUMENTS

| | | | |
|---|---|---|---|
| JP | 2016-170361 | A | 9/2016 |
| JP | 2021-39171 | A | 3/2021 |
| JP | 2021-63985 | A | 4/2021 |
| KR | 1996-0015376 | B1 | 8/1990 |
| KR | 2001-0023941 | A | 3/2001 |
| KR | 10-0881301 | B1 | 4/2004 |
| KR | 10-2020-0014185 | A | 2/2020 |
| KR | 10-2020-0014216 | A | 2/2020 |
| KR | 10-2022-0035749 | A | 3/2022 |
| TW | 202219632 | A | 5/2022 |

OTHER PUBLICATIONS

Korean Notice of Allowance for KR Application No. 10-2022-0085855, dated Jul. 23, 2025, 3 pages.

Hiroshi Okamoto et al., Peroxypolytungstic acids: A new inorganic resist material, Applied Physics Letters, Aug. 1986, pp. 298-300, vol. 49, No. 5, AIP Publishing.

Jason K. Stowers et al., Directly patterned inorganic hardmask for EUV lithography, Extreme Ultraviolet (EUV) Lithography II, Proc. of SPIE, 2011, vol. 7969, pp. 796915-1 to 796915-11.

Office Action and search report dated Jan. 29, 2024, of the corresponding Taiwanese Patent Application No. 112118611, 4 pages.

* cited by examiner

SEMICONDUCTOR PHOTORESIST COMPOSITION AND METHOD OF FORMING PATTERNS USING THE COMPOSITION

CROSS-REFERENCE TO RELATED APPLICATION

This application claims priority to and the benefit of Korean Patent Application No. 10-2022-0085855, filed in the Korean Intellectual Property Office on Jul. 12, 2022, the entire content of which is incorporated herein by reference.

BACKGROUND

1. Field

This disclosure relates to a semiconductor photoresist composition and a method of forming patterns utilizing the same.

2. Description of the Related Art

Extreme ultraviolet (EUV) lithography has drawn attention as one promising (e.g., essential) technology for manufacturing a next generation semiconductor device. The EUV lithography is a pattern-forming technology utilizing an EUV ray having a wavelength of 13.5 nm as an exposure light source. Utilizing the EUV lithography, an extremely fine pattern (e.g., less than or equal to 20 nm) may be formed in an exposure process during manufacturing of a semiconductor device.

The EUV lithography is realized through development of compatible photoresists, which can be performed at a spatial resolution of less than or equal to 16 nm. Currently, efforts are being made to address unsatisfactory specifications, such as resolution, photospeed, and feature roughness (also referred to as a line edge roughness or LER) of related art chemically amplified (CA) photoresists for the next generation device.

An intrinsic image blurring due to an acid catalyzed reaction in the polymer-type or kind photoresists limits a resolution in small feature sizes, which has been well known in electron beam (e-beam) lithography for a long time. The chemically amplified (CA) photoresists are designed for high sensitivity, but because their typical elemental makeups reduce light absorbance of the photoresists at a wavelength of 13.5 nm and thus decrease their sensitivity, the chemically amplified (CA) photoresists may (e.g., partially) have more difficulties under an EUV exposure.

In addition, the CA photoresists may have difficulties in obtaining smaller or finer feature sizes due to roughness issues, and line edge roughness (LER) of the CA photoresists turns out to be increased in experiments, as a photospeed is decreased partially due to an essence of acid catalyst processes. Accordingly, a novel high-performance photoresist is desired or required in a semiconductor industry because of these defects and problems of the CA photoresists.

In order to overcome the aforementioned drawbacks of the chemically amplified (CA) organic photosensitive composition, an inorganic photosensitive composition has been researched. The inorganic photosensitive composition is mainly utilized for negative tone patterning having resistance against removal by a developer composition due to chemical modification through a nonchemical amplification mechanism. The inorganic composition contains an inorganic element having a higher EUV absorption rate than hydrocarbons and thus may secure sensitivity through the nonchemical amplification mechanism. In addition, the inorganic composition is less sensitive to a stochastic effect, and thus may be suitable to have lower line edge roughness and smaller number of defects.

Inorganic photoresists based on peroxopolyacids of tungsten mixed with tungsten (W), niobium (Nb), titanium (Ti), and/or tantalum (Ta) have been reported as radiation sensitive materials for patterning.

These materials are effective for patterning large pitches for bilayer configuration utilizing far ultraviolet (deep UV), X-ray, and electron beam sources. More recently, when cationic hafnium metal oxide sulfate (HfSOx) materials along with a peroxo complexing agent has been utilized to image a 15 nm half-pitch (HP) through projection EUV exposure, desirable performance has been obtained. This system exhibits higher (e.g., the highest) performance of a non-CA photoresist and has a practicable photospeed close to meeting a requirement for an EUV photoresist. However, the hafnium metal oxide sulfate material having the peroxo complexing agent has a few practical drawbacks. First, these materials are coated in a mixture of corrosive sulfuric acid/hydrogen peroxide and have insufficient shelf-life stability. Second, a structural change thereof for performance improvement as a composite mixture is not easy. Third, development is to be performed in a TMAH (tetramethylammonium hydroxide) solution at an extremely high concentration of 25 wt % and/or the like.

SUMMARY

Recently, active research has been conducted because molecules containing tin have excellent or suitable absorption of extreme ultraviolet rays. Among them, as for an organic tin polymer, alkyl ligands are dissociated by light absorption or secondary electrons produced thereby, and are cross-linked with adjacent chains through oxo bonds and thus enable the negative tone patterning which may not be removed by an organic developing solution. This organic tin polymer exhibits improved (e.g., greatly improved) sensitivity as well as maintains a resolution and line edge roughness, but the patterning characteristics need to be additionally improved for commercial availability.

Aspects of the present disclosure are directed toward a semiconductor photoresist composition capable of implementing a pattern with significantly improved sensitivity while maintaining line edge roughness.

Aspects of the present disclosure are directed toward a method of forming patterns utilizing the semiconductor photoresist composition.

Additional aspects will be set forth in part in the description which follows and, in part, will be apparent from the description, or may be learned by practice of the presented embodiments.

The semiconductor photoresist composition according to an embodiment includes a first organometallic compound including a metal selected from Sn, Sb, In, Bi, Zr, and Hf, a second organometallic compound represented by Chemical Formula 1, and a solvent.

Chemical Formula 1

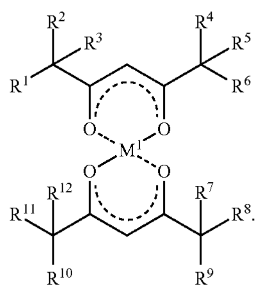

In Chemical Formula 1, $M^1$ may be a metal selected from Sn, Sb, and Te, and $R^1$ to $R^{12}$ may each independently be hydrogen, a halogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

The first organometallic compound may include a metal-carbon bond and at least one substituent forming a hydrolyzable bond with the metal selected from Sn, Sb, In, Bi, Zr, and Hf.

The substituent forming the hydrolyzable bond with the metal may be selected from an amino group represented by $—NR^aR^b$, wherein $R^a$ and $R^b$ may each independently be hydrogen or a C1 to C30 hydrocarbon group, a silyloxo group represented by $—OSiR^aR^bR^c$, wherein $R^a$, $R^b$, and $R^c$ may each independently be a C1 to C30 hydrocarbon group, a silylamino group represented by $—N(SiR^a_3)(R^b)$, wherein $R^a$ and $R^b$ may each independently be a C1 to C30 hydrocarbon group, a disilylamino group represented by $—N(SiR^a_3)(SiR^b_3)$, wherein $R^a$ and $R^b$ may each independently be a C1 to C30 hydrocarbon group, an alkoxo group and an aryloxo group represented by $—OR^a$, wherein $R^a$ may be a C1 to C30 alkyl group or an aryl group, a carboxyl group represented by $—O(COR^a)$, wherein $R^a$ may be hydrogen or a C1 to C30 hydrocarbon group, an azido group ($—N_3$), an alkyne group represented by $—C{\equiv}CR^a$, wherein $R^a$ may be a C1 to C30 hydrocarbon group, an amido group represented by $—NR^a(COR^b)$, wherein $R^a$ and $R^b$ may each independently be hydrogen or a C1 to C30 hydrocarbon group, an amidinato group represented by $—NR^aC(NR^b)R^c$, wherein $R^a$, $R^b$, and $R^c$ may each independently be hydrogen or a C1 to C30 hydrocarbon group, an imido group represented by $—N(COR^a)(COR^b)$, wherein $R^a$ and $R^b$ may each independently be hydrogen or a C1 to C30 hydrocarbon group, or a combination thereof.

The first organometallic compound may be represented by Chemical Formula 2a.

Chemical Formula 2a

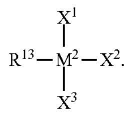

In Chemical Formula 2a, $M^2$ may be a metal selected from Sn, Sb, In, Bi, Zr, and Hf, $R^{13}$ may be selected from a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C7 to C31 arylalkyl group, and $-L^a-O—R^d$, wherein $L^a$ may be a substituted or unsubstituted C1 to C20 alkylene group and $R^d$ may be a substituted or unsubstituted C1 to C20 alkyl group, $X^1$ to $X^3$ may each independently be selected from $—N_3$, $—NR^{14}R^{15}$, $—O(COR^{16})$, $—NR^{17}(COR^{18})$, $—NR^{19}C(NR^{20})R^{21}$, $—N(COR^{22})(COR^{23})$, $—OSiR^{24}R^{25}R^{26}$, $—N(SiR^{27}_3)(R^{28})$, $—N(SiR^{29}_3)(SiR^{30}_3)$, $—OR^{31}$, and $—C{\equiv}CR^{32}$, $R^{14}$ to $R^{23}$ may each independently be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^{24}$ to $R^{32}$ may each independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

In Chemical Formula 2a, $X^1$ to $X^3$ may each independently be $—O(COR^{16})$, or $—OR^{31}$, $R^{16}$ may be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^{31}$ may, at each occurrence, independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

In Chemical Formula 2a, $M^2$ may be Sn.

The first organometallic compound may include at least one of compounds of Group 1.

Group 1

Chemical Formula 3

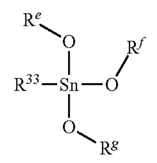

Chemical Formula 4

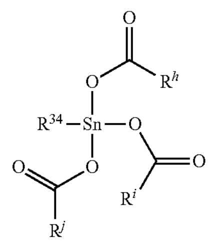

-continued

Chemical Formula 5

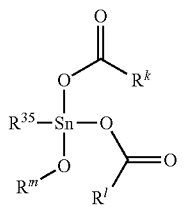

Chemical Formula 6

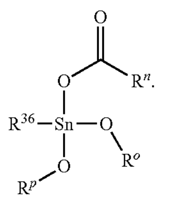

In Chemical Formula 3 to Chemical Formula 6, $R^{33}$ to $R^{36}$ may each independently be a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethoxy group, a propoxy group, or a combination thereof, $R^e$, $R^f$, $R^g$, $R^m$, $R^o$, and $R^p$ may each independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, $R^h$, $R^i$, $R^j$, $R^k$, $R^l$, and $R^n$ may each independently be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

The first organometallic compound may be represented by Chemical Formula 2b.

Chemical Formula 2b

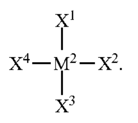

In Chemical Formula 2b, $M^2$ may be a metal selected from Sn, Sb, In, Bi, Zr, and Hf, $X^1$ to $X^4$ may each independently be selected from —$N_3$, —$NR^{14}R^{15}$, —$O(COR^{16})$, —$NR^{17}(COR^{18})$, —$NR^{19}C(NR^{20})R^{21}$, —$N(COR^{22})(COR^{23})$, —$OSiR^{24}R^{25}R^{26}$, —$N(SiR^{27}_3)(R^{28})$, —$N(SiR^{29}_3)(SiR^{30}_3)$, —$OR^{31}$, and —$C{\equiv}CR^{32}$, $R^{14}$ to $R^{23}$ may each independently be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^{24}$ to $R^{32}$ may each independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

In Chemical Formula 2b, $X^1$ to $X^4$ may each independently be —$O(COR^{16})$, or —$OR^{31}$ $R^{16}$ may be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^{31}$ may, at each occurrence, independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

In Chemical Formula 2b, $M^2$ may be Sn.

The first organometallic compound may be represented by Chemical Formula 2c.

Chemical Formula 2c

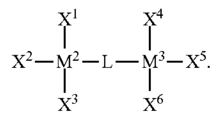

In Chemical Formula 2c, $M^2$ and $M^3$ may each independently be a metal selected from Sn, Sb, In, Bi, Zr, and Hf, $X^1$ to $X^6$ may each independently be selected from —$N_3$, —$NR^{14}R^{15}$, —$O(COR^{16})$, —$NR^{17}(COR^{18})$, —$NR^{19}C(NR^{20})R^{21}$, —$N(COR^{22})(COR^{23})$, —$OSiR^{24}R^{25}R^{26}$, —$N(SiR^{27}_3)(R^{28})$, —$N(SiR^{29}_3)(SiR^{30}_3)$, —$OR^{31}$, and —$C{\equiv}CR^{32}$, $R^{14}$ to $R^{23}$ may each independently be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, $R^{24}$ to $R^{32}$ may each independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and L may be a single bond, a substituted or unsubstituted divalent C1 to C20 saturated aliphatic hydrocarbon group, a substituted or unsubstituted divalent C3 to C20 saturated or unsaturated alicyclic hydrocarbon group, a substituted or unsubstituted divalent C2 to C20 unsaturated aliphatic hydrocarbon group including at least one double bond or triple bond, a substituted or unsubstituted divalent C6 to C20 aromatic hydrocarbon group, —O—, —C(=O)—, or a combination thereof.

In Chemical Formula 2c, $X^1$ to $X^6$ may each independently be —O(COR$^{16}$), or —OR$^{31}$ wherein $R^{16}$ may be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^{31}$ may, at each occurrence, independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

$M^2$ and $M^3$ in Chemical Formula 2c may each independently be Sn.

At least one of $R^1$ to $R^{12}$ in Chemical Formula 1 may be a halogen.

$R^1$ to $R^{12}$ in Chemical Formula 1 may each independently be hydrogen, a halogen, a substituted or unsubstituted C1 to C10 alkyl group, a substituted or unsubstituted C3 to C10 cycloalkyl group, a substituted or unsubstituted C2 to C10 alkenyl group, a substituted or unsubstituted C2 to C20 alkynyl group, a substituted or unsubstituted C6 to C20 aryl group, or a combination thereof, and at least one of $R^1$ to $R^{12}$ may be a halogen.

$R^1$ to $R^{12}$ in Chemical Formula 1 may each be fluoro (—F).

The second organometallic compound may be about 1 part to 50 parts by weight in amount based on 100 parts by weight of the first organometallic compound.

The second organometallic compound may be about 1 part to 30 parts by weight in amount based on 100 parts by weight of the first organometallic compound.

Based on 100 wt % of the semiconductor photoresist composition, a total amount of the first organometallic compound and the second organometallic compound may be about 0.5 wt % to about 30 wt %.

The semiconductor photoresist composition may further include an additive selected from a surfactant, a crosslinking agent, a leveling agent, or a combination thereof.

A method of forming patterns according to an embodiment includes forming an etching-objective layer on a substrate, coating the semiconductor photoresist composition on the etching-objective layer to form a photoresist layer, patterning the photoresist layer to form a photoresist pattern, and etching the etching-objective layer utilizing the photoresist pattern as an etching mask.

The photoresist pattern may be formed utilizing light in a wavelength of about 5 nm to about 150 nm.

The method may further include forming a resist underlayer between the substrate and the photoresist layer.

The photoresist pattern may have a width of about 5 nm to about 100 nm.

The semiconductor photoresist composition according to the embodiment may provide a photoresist pattern with improved sensitivity while maintaining line edge roughness.

DETAILED DESCRIPTION

Figure 1:
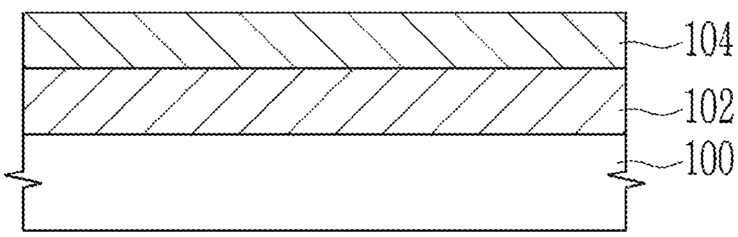
FIGS. 1-5 are cross-sectional views schematically illustrating a method of forming patterns utilizing a semiconductor photoresist composition according to an embodiment.

Hereinafter, referring to the drawings, embodiments of the present disclosure are described in more detail. In the following description of the present disclosure, the known functions or constructions will not be described in order to clarify the present disclosure.

In order to clearly describe the present disclosure, throughout the disclosure, the same or similar configuration elements are designated by the same reference numerals, and duplicative descriptions thereof may not be provided. Also, because the size and thickness of each configuration shown in the drawings may be arbitrarily shown for better understanding and ease of description, the present disclosure is not necessarily limited thereto.

In the drawings, the thickness of layers, films, panels, regions, etc., may be exaggerated for clarity. In the drawings, the thickness of a part of layers or regions, etc., may be exaggerated for clarity. It will be understood that when an element such as a layer, film, region, or substrate is referred to as being "on" another element, it can be directly on the other element or intervening elements may also be present.

As used herein, the term "substituted" refers to replacement of a hydrogen atom by deuterium, a halogen (e.g., a halogen atom), a hydroxy group, a cyano group, a nitro group, —NRR' (wherein, R and R' may each independently be hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), —SiRR'R" (wherein, R, R', and R" may each independently be hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), a C1 to C30 alkyl group, a C1 to C10 haloalkyl group, a C1 to C10 alkylsilyl group, a C3 to C30 cycloalkyl group, a C6 to C30 aryl group, a C1 to C20 alkoxy group, or a combination thereof. The term "unsubstituted" refers to that a hydrogen atom (or any remaining hydrogen atom) is not replaced by another substituent and remains as the hydrogen atom.

As used herein, when a definition is not otherwise provided, the term "an alkyl group" refers to a linear or branched aliphatic hydrocarbon group. The alkyl group may be "a saturated alkyl group" without any double bond or triple bond.

The alkyl group may be a C1 to C10 alkyl group. For example, the alkyl group may be a C1 to C8 alkyl group, a C1 to C7 alkyl group, a C1 to C6 alkyl group, a C1 to C5 alkyl group, or a C1 to C4 alkyl group. For example, the C1 to C4 alkyl group may be a methyl group, an ethyl group, a propyl group, an isopropyl group, an n-butyl group, an isobutyl group, a sec-butyl group, a tert-butyl group, or a 2,2-dimethylpropyl group.

As used herein, when a definition is not otherwise provided, the term "cycloalkyl group" refers to a monovalent cyclic aliphatic hydrocarbon group.

The cycloalkyl group may be a C3 to C10 cycloalkyl group, for example, a C3 to C8 cycloalkyl group, a C3 to C7 cycloalkyl group, a C3 to C6 cycloalkyl group, a C3 to C5 cycloalkyl group, or a C3 to C4 cycloalkyl group. For example, the cycloalkyl group may be a cyclopropyl group, a cyclobutyl group, a cyclopentyl group, or a cyclohexyl group, but the present disclosure is not limited thereto.

As used herein, the term "aryl group" refers to a substituent in which all atoms in the cyclic structure of the substituent have a p-orbital and these p-orbitals are conjugated and may include a monocyclic functional group or fused ring polycyclic functional group (i.e., rings sharing adjacent pairs of carbon atoms).

As used herein, when a definition is not otherwise provided, the term "alkenyl group" refers to an aliphatic unsaturated alkenyl group including at least one double bond as a linear or branched aliphatic hydrocarbon group.

As used herein, unless otherwise defined, the term "alkynyl group" refers to an aliphatic unsaturated alkynyl group including at least one triple bond as a linear or branched aliphatic hydrocarbon group.

In the formulas described herein, t-Bu refers to a tert-butyl group.

Hereinafter, a semiconductor photoresist composition according to an embodiment is described.

A semiconductor photoresist composition according to an embodiment includes a first organometallic compound including a metal selected from tin (Sn), antimony (Sb), indium (In), bismuth (Bi), zirconium (Zr), and hafnium (Hf), a second organometallic compound represented by Chemical Formula 1, and a solvent.

Chemical Formula 1

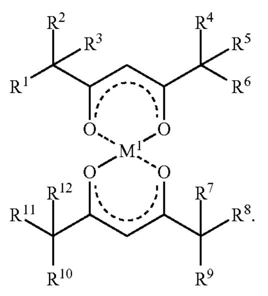

In Chemical Formula 1, $M^1$ may be a metal selected from Sn, Sb, and Te, and $R^1$ to $R^{12}$ may each independently be hydrogen, a halogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

The semiconductor photoresist composition according to an embodiment includes the second organometallic compound together (e.g., concurrently) with the first organometallic compound, thereby improving the sensitivity and line edge roughness of the pattern after exposure.

The first organometallic compound may include a metal-carbon bond; and at least one substituent forming a hydrolyzable bond with the metal selected from Sn, Sb, In, Bi, Zr, and Hf.

The substituent forming the hydrolyzable bond with the metal may be selected from an amino group ($—NR^aR^b$, wherein $R^a$ and $R^b$ may each independently be hydrogen or a C1 to C30 hydrocarbon group), a silyloxo group ($—OSiR^aR^bR^c$, wherein $R^a$, $R^b$, and $R^c$ may each independently be a C1 to C30 hydrocarbon group), a silylamino group ($—N(SiR^a_3)(R^b)$, wherein $R^a$ and $R^b$ may each independently be a C1 to C30 hydrocarbon group), a disilylamino group ($—N(SiR^a_3)(SiR^b_3)$, wherein $R^a$ and $R^b$ may each independently be a C1 to C30 hydrocarbon group), an alkoxo group and an aryloxo group ($—OR^a$, wherein $R^a$ may be a C1 to C30 alkyl group or an aryl group), a carboxyl group ($—O(COR^a)$, wherein $R^a$ may be hydrogen or a C1 to C30 hydrocarbon group), an azido group ($—N_3$), an alkyne group ($—C≡CR^a$, wherein $R^a$ may be a C1 to C30 hydrocarbon group), an amido group ($—NR^a(COR^b)$, wherein $R^a$ and $R^b$ may each independently be hydrogen or a C1 to C30 hydrocarbon group), an amidinato group ($—NR^aC(NR^b)R^c$, wherein $R^a$, $R^b$, and $R^c$ may each independently be hydrogen or a C1 to C30 hydrocarbon group), an imido group ($—N(COR^a)(COR^b)$, wherein $R^a$ and $R^b$ may each independently be hydrogen or a C1 to C30 hydrocarbon group), or a combination thereof.

For example, the first organometallic compound may be represented by Chemical Formula 2a.

Chemical Formula 2a

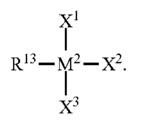

In Chemical Formula 2a, $M^2$ may be a metal selected from Sn, Sb, In, Bi, Zr, and Hf, $R^{13}$ may be selected from a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C7 to C31 arylalkyl group, and $-L^a-O—R^d$ (wherein $L^a$ may be a substituted or unsubstituted C1 to C20 alkylene group and $R^d$ may be a substituted or unsubstituted C1 to C20 alkyl group), $X^1$ to $X^3$ may each independently be selected from $—N_3$, $—NR^{14}R^{15}$, $—O(COR^{16})$, $—NR^{17}(COR^{18})$, $—NR^{19}C(NR^{20})R^{21}$, $—N(COR^{22})(COR^{23})$, $—OSiR^{24}R^{25}R^{26}$, $—N(SiR^{27}_3)(R^{28})$, $—N(SiR^{29}_3)(SiR^{30}_3)$, $—OR^{31}$, and $—C≡CR^{32}$, $R^{14}$ to $R^{23}$ may each independently be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^{24}$ to $R^{32}$ may each independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

For example, the first organometallic compound may be represented by Chemical Formula 2b.

Chemical Formula 2b

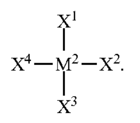

In Chemical Formula 2b, $M^2$ may be a metal selected from Sn, Sb, In, Bi, Zr, and Hf, $X^1$ to $X^4$ may each independently be selected from $—N_3$, $—NR^{14}R^{15}$, $—O(COR^{16})$, $—NR^{17}(COR^{18})$, $—NR^{19}C(NR^{20})R^{21}$, $—N(COR^{22})(COR^{23})$, $—OSiR^{24}R^{25}R^{26}$, $—N(SiR^{27}_3)(R^{28})$, $—N(SiR^{29}_3)(SiR^{30}_3)$, $—OR^{31}$, and $—C≡CR^{32}$, $R^{14}$ to $R^{23}$ may each independently be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^{24}$ to $R^{32}$ may each independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

For example, the first organometallic compound may be represented by Chemical Formula 2c.

Chemical Formula 2c

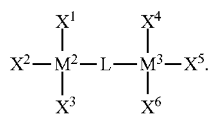

In Chemical Formula 2c, $M^2$ and $M^3$ may each independently be a metal selected from Sn, Sb, In, Bi, Zr, and Hf, $X^1$ to $X^6$ may each independently be selected from $—N_3$, $—NR^{14}R^{15}$, $—O(COR^{16})$, $—NR^{17}(COR^{18})$, $—NR^{19}C(NR^{20})R^{21}$, $—N(COR^{22})(COR^{23})$, $—OSiR^{24}R^{25}R^{26}$, $—N(SiR^{27}_3)(R^{28})$, $—N(SiR^{29}_3)(SiR^{30}_3)$, $—OR^{31}$, and $—C≡CR^{32}$, $R^{14}$ to $R^{23}$ may each independently be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, $R^{24}$ to $R^{32}$ may each independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and L may be a single bond, a substituted or unsubstituted divalent C1 to C20 saturated aliphatic hydrocarbon group, a substituted or unsubstituted divalent C3 to C20 saturated or unsaturated alicyclic hydrocarbon group, a substituted or unsubstituted divalent C2 to C20 unsaturated aliphatic hydrocarbon group including at least one double bond or triple bond, a substituted or unsubstituted divalent C6 to C20 aromatic hydrocarbon group, —O—, —C(═O)—, or a combination thereof.

$X^1$ to $X^6$ in Chemical Formula 2a to Chemical Formula 2c may each be a substituent providing a hydrolyzable bond to a metal and each bond of $M^2$-$X^1$, $M^2$-$X^2$, $M^2$-$X^3$, $M^3$-$X^4$, $M^3$-$X^5$, and $M^3$-$X^6$ may react appropriately with water and/or acidic protons through hydrolysis and/or solvolysis to form readily volatilized products. Thus, $X^1$ to $X^6$ generally contain atoms that bind to metals such as tin and may undergo nucleophilic substitutions involving $H_2O$ and —OH. The resulting $M''$-OH or $M''$-$OH_2$ (n being 2 or 3) ligand may then be reacted through a subsequent condensation or dehydration process (polymerization reaction) to form an oxide-hydroxide network.

In an embodiment, $X^1$ to $X^6$ in Chemical Formula 2a to Chemical Formula 2c may each independently be $—O(COR^{16})$, or $—OR^{31}$, $R^{16}$ may be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^{31}$ may, at each occurrence, independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

In an embodiment, each of $M^2$ and $M^3$ in Chemical Formulas 2a to 2c may be Sn.

In some embodiments, $R^{13}$ in Chemical Formula 2a may be a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof. In an embodiment, $R^{13}$ in Chemical Formula 2a may be, for example, hydrogen, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or a combination thereof.

In an embodiment, $R^{13}$ in Chemical Formula 2a may be a substituted or unsubstituted C1 to C8 alkyl group or a substituted or unsubstituted C3 to C8 cycloalkyl group.

In an embodiment, $R^{13}$ in Chemical Formula 2a may be a linear alkyl group, a branched alkyl group, or a substituted or unsubstituted C3 to C8 cycloalkyl group.

The linear alkyl group refers to a form in which a metal-bonded carbon atom consists only of primary carbon, and $R^{13}$ in Chemical Formula 2a may be, for example, n-propyl, n-butyl, n-pentyl, or n-hexyl.

The branched alkyl group refers to a form in which a metal-bonded carbon atom is a secondary carbon, a tertiary carbon, or a quaternary carbon, and $R^{13}$ in Chemical Formula 2a may be, for example, isopropyl, tert-butyl, tert-amyl, or sec-butyl.

Examples of the cycloalkyl group may include cyclohexyl, cyclopentyl, cyclobutyl, and cyclopropyl.

More non-limiting specific examples of Chemical Formula 2a may include compounds of Group 1.

Group 1

Chemical Formula 3

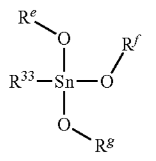

Chemical Formula 4

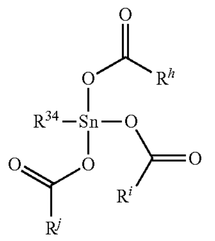

Chemical Formula 5

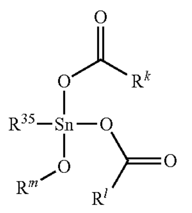

Chemical Formula 6

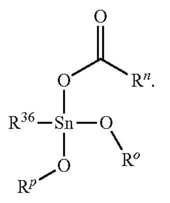

In Chemical Formula 3 to Chemical Formula 6, $R^{33}$ to $R^{36}$ may each independently be a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethoxy group, a propoxy group, or a combination thereof, $R^e$, $R^f$, $R^g$, $R^m$, $R^o$, and $R^P$ may each independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^h$, $R^i$, $R^j$, $R^k$, $R^l$, and $R^n$ may each independently be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

In some embodiments, $R^{33}$ to $R^{36}$ may each independently be isopropyl, tert-butyl, tert-amyl, sec-butyl, cyclohexyl, cyclopentyl, cyclobutyl, or cyclopropyl.

The second organometallic compound may be represented by Chemical Formula 1.

In an embodiment, at least one of $R^1$ to $R^{12}$ in Chemical Formula 1 may be a halogen (e.g., a halogen atom).

Non-limiting examples of the halogen may include fluoro (—F), chloro (—Cl), bromo (—Br), and iodo (—I), and in an embodiment of the present disclosure, at least one of $R^1$ to $R^{12}$ may be fluoro (—F).

In some embodiments, $R^1$ to $R^{12}$ in Chemical Formula 1 may each independently be hydrogen, a halogen, a substituted or unsubstituted C1 to C10 alkyl group, a substituted or unsubstituted C3 to C10 cycloalkyl group, a substituted or unsubstituted C2 to C10 alkenyl group, a substituted or unsubstituted C2 to C10 alkynyl group, a substituted or unsubstituted C6 to C20 aryl group, or a combination thereof, and at least one of $R^1$ to $R^{12}$ may be a halogen.

In an embodiment, each of $R^1$ to $R^{12}$ in Chemical Formula 1 may be fluoro (—F).

In an embodiment, $M^1$ may be Sn.

In the organotin compound in which $M^1$ is Sn, tin may suitably (e.g., strongly) absorb extreme ultraviolet light with a wavelength of about 13.5 nm, and thus may have excellent or suitable sensitivity to light having high energy.

In some embodiments, the second organometallic compound may be included in an amount of about 1 to 50 parts by weight, for example, about 1 to 40 parts by weight, or about 1 to 30 parts by weight based on 100 parts by weight of the first organometallic compound. Within the above ranges, a semiconductor photoresist composition having excellent or suitable sensitivity and excellent or suitable line edge roughness (LER) of a formed pattern may be provided.

In some embodiments, the second organometallic compound and the first organometallic compound may be included at a weight ratio (weight of the second organometallic compound:weight of the first organometallic compound) of about 1:2 to about 1:20, for example, about 1:2 to about 1:19, for example, about 1:2 to about 1:18, for example, about 1:2 to about 1:17, for example, about 1:2 to about 1:16, for example, about 1:2 to about 1:15, for example, about 1:2 to about 1:14, for example, about 1:2 to about 1:13, for example, about 1:2 to about 1:12, for example, about 1:2 to about 1:11, for example, about 1:2 to about 1:10, but the present disclosure is not limited thereto. When the weight ratio of the first organometallic compound to the second organometallic compound satisfies the above ranges, a semiconductor photoresist composition having excellent or suitable sensitivity and resolution may be provided.

In the semiconductor photoresist composition according to an embodiment, a total amount of the organometallic compound including the first organometallic compound and the second organometallic compound may be about 0.5 wt % to about 30 wt %, for example, about 1 wt % to about 25 wt %, for example, about 1 wt % to about 20 wt %, for example, about 1 wt % to about 15 wt %, for example, about 1 wt % to about 10 wt %, and for example, about 1 wt % to about 5 wt % based on 100 wt % of the semiconductor photoresist composition, but the present disclosure is not limited thereto. When the organometallic compound is included in the content (e.g., amount) within the above ranges, storage stability and etch resistance of the semiconductor photoresist compositions may be improved, and resolution characteristics may be improved.

Because the semiconductor photoresist composition according to an embodiment includes the first organometallic compound and the second organometallic compound at the same time (e.g., concurrently), a semiconductor photoresist composition having excellent or suitable sensitivity and pattern formation properties may be provided.

The first organometallic compound may be, for example, represented by any one of Chemical Formula 2a to Chemical Formula 2c, and by appropriately adjusting the mixing ratio of the first organometallic compound represented by Chemical Formulas 2a, 2b or 2c (e.g., with the second organometallic compound), a degree of dissociation of the ligand from the copolymer may be controlled or selected. Accordingly, a degree of crosslinking through oxo bonding with the surrounding chain may be controlled or selected by radicals generated while the ligand is dissociated, and as a result, a semiconductor photoresist having excellent or suitable sensitivity, low or suitable line edge roughness, and excellent or suitable resolution may be provided.

The solvent of the semiconductor resist composition according to the embodiment may be an organic solvent, and may be, for example, one or more aromatic compounds (e.g., xylene, toluene, etc.), alcohols (e.g., 4-methyl-2-pentenol, 4-methyl-2-propanol, 1-butanol, methanol, isopropyl alcohol, 1-propanol, etc.), ethers (e.g., anisole, tetrahydrofuran, etc.), esters (n-butyl acetate, propylene glycol monomethyl ether acetate, ethyl acetate, ethyl lactate, etc.), ketones (e.g., methyl ethyl ketone, 2-heptanone, etc.), or a mixture thereof, but the present disclosure is not limited thereto.

In an embodiment, the semiconductor resist composition may further include a resin in addition to the first organometallic compound, the second organometallic compound, and the solvent.

The resin may be a phenolic resin including at least one aromatic moiety selected from Group 2.

Group 2

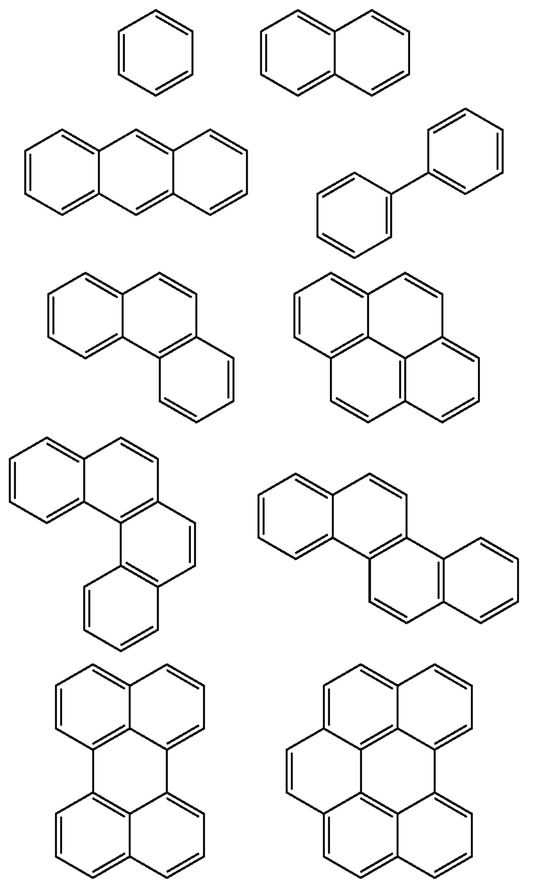

-continued

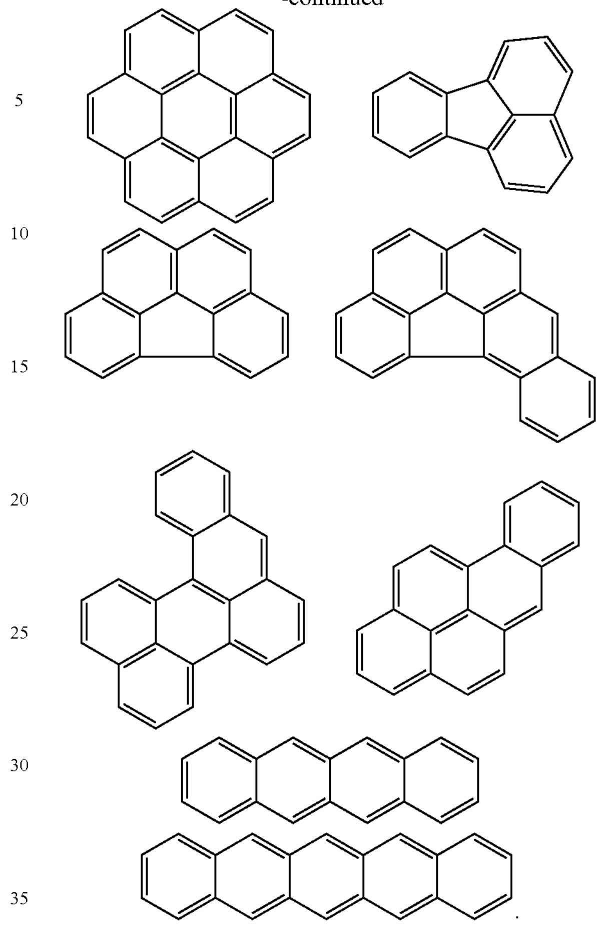

The resin may have a weight average molecular weight of about 500 to about 20,000.

The resin may be included in an amount of about 0.1 wt % to about 50 wt % based on the total amount of the semiconductor resist composition.

When the resin is included in the above content (e.g., amount) range, the semiconductor resist composition may have excellent or suitable etch resistance and heat resistance.

In some embodiments, the semiconductor resist composition according to an embodiment may include (e.g., consist of) the aforementioned first organometallic compound, second organometallic compound, solvent, and resin. However, in an embodiment, the semiconductor resist composition according to the aforementioned embodiment may further include one or more additives as needed. Examples of the additives may include a surfactant, a crosslinking agent, a leveling agent, an organic acid, a quencher, or a combination thereof.

The surfactant may include, for example, an alkyl benzene sulfonate salt, an alkyl pyridinium salt, polyethylene glycol, a quaternary ammonium salt, or a combination thereof, but the present disclosure is not limited thereto.

The crosslinking agent may be, for example, a melamine-based crosslinking agent, a substituted urea-based crosslinking agent, an acryl-based crosslinking agent, an epoxy-based crosslinking agent, and/or a polymer-based crosslinking agent, but the present disclosure is not limited thereto. The crosslinking agent may have at least two crosslinking-forming substituents, for example, the crosslinking agent may include a compound such as methoxymethylated glycoluril, butoxymethylated glycoluril, methoxymethylated melamine, butoxymethylated melamine, methoxymethylated benzoguanamine, butoxymethylated benzoguanamine, 4-hydroxybutyl acrylate, acrylic acid, urethane acrylate, acryl methacrylate, 1,4-butanediol diglycidyl ether, glycidol, diglycidyl 1,2-cyclohexane dicarboxylate, trimethylpropane triglycidyl ether, 1,3-bis(glycidoxypropyl)tetramethyldisiloxane, methoxymethylated urea, butoxymethylated urea, methoxymethylated thiourea, and/or the like.

The leveling agent may be utilized for improving coating flatness during printing and may be a commercially available suitable leveling agent.

The organic acid may be p-toluenesulfonic acid, benzenesulfonic acid, p-dodecylbenzene sulfonic acid, 1,4-naphthalene disulfonic acid, methane sulfonic acid, a luorinated sulfonium salt, malonic acid, citric acid, propionic acid, methacrylic acid, oxalic acid, lactic acid, glycolic acid, succinic acid, or a combination thereof, but the present disclosure is not limited thereto.

The quencher may be diphenyl(p-tolyl) amine, methyl diphenyl amine, triphenyl amine, phenylenediamine, naphthylamine, diaminonaphthalene, or a combination thereof.

An amount of the additives may be controlled or selected depending on desired properties.

In some embodiments, the semiconductor photoresist composition may further include a silane coupling agent as an adhesion enhancer in order to improve a close-contacting force with the substrate (e.g., in order to improve adhesion (e.g., adherence) of the semiconductor photoresist composition to the substrate). The silane coupling agent may be, for example, a silane compound including a carbon-carbon unsaturated bond such as vinyltrimethoxysilane, vinyltriethoxysilane, vinyl trichlorosilane, and/or vinyltris(β-methoxyethoxy)silane; 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyl diethoxysilane; trimethoxy[3-(phenylamino)propyl]silane, and/or the like, but the present disclosure is not limited thereto.

The semiconductor photoresist composition may be formed into a pattern having a high aspect ratio without collapsing. Accordingly, in order to form a fine pattern having a width of, for example, about 5 nm to about 100 nm, for example, about 5 nm to about 80 nm, for example, about 5 nm to about 70 nm, for example, about 5 nm to about 50 nm, for example, about 5 nm to about 40 nm, for example, about 5 nm to about 30 nm, or for example, about 5 nm to about 20 nm, the semiconductor photoresist composition may be utilized for a photoresist process utilizing light in a wavelength range of about 5 nm to about 150 nm, for example, about 5 nm to about 100 nm, about 5 nm to about 80 nm, about 5 nm to about 50 nm, about 5 nm to about 30 nm, or about 5 nm to about 20 nm. Accordingly, the semiconductor photoresist composition according to an embodiment may be utilized to realize extreme ultraviolet lithography utilizing an EUV light source of a wavelength of about 13.5 nm.

According to another embodiment, a method of forming patterns utilizing the aforementioned semiconductor photoresist composition is provided. For example, the manufactured pattern may be a photoresist pattern.

The method of forming patterns according to an embodiment includes forming an etching-objective layer on a substrate, coating the semiconductor photoresist composition on the etching-objective layer to form a photoresist layer, patterning the photoresist layer to form a photoresist pattern, and etching the etching-objective layer utilizing the photoresist pattern as an etching mask.

Hereinafter, a method of forming patterns utilizing the semiconductor photoresist composition is described referring to FIGS. 1 to 5. FIGS. 1 to 5 are cross-sectional views for explaining a method of forming patterns utilizing a semiconductor photoresist composition according to an embodiment.

Referring to FIG. 1, an object for etching is prepared. The object for etching may be a thin film 102 formed on a semiconductor substrate 100. Hereinafter, the object for etching is limited to the thin film 102, however, the present disclosure is not limited thereto. A whole surface of the thin film 102 is washed to remove impurities and/or the like remaining thereon. The thin film 102 may be, for example, a silicon nitride layer, a polysilicon layer, and/or a silicon oxide layer.

Subsequently, the resist underlayer composition for forming a resist underlayer 104 is spin-coated on the surface of the washed thin film 102. However, the embodiment is not limited thereto, and one or more suitable coating methods, for example, a spray coating, a dip coating, and/or a knife edge coating, a printing method, for example an inkjet printing and/or a screen printing, and/or the like may be utilized.

In some embodiments, the coating process of the resist underlayer may not be provided (e.g., the resist underlayer is not included), and hereinafter, a process including a coating of the resist underlayer is described.

Then, the coated composition is dried and baked to form a resist underlayer 104 on the thin film 102. The baking may be performed at about 100° C. to about 500° C., for example, about 100° C. to about 300° C.

The resist underlayer 104 is formed between the substrate 100 and a photoresist layer 106 and thus may prevent or reduce non-uniformity and pattern-forming capability of a photoresist line width when a ray reflected from the interface between the substrate 100 and the photoresist layer 106 or a hardmask between layers is scattered into an unintended photoresist region.

Figure 2:
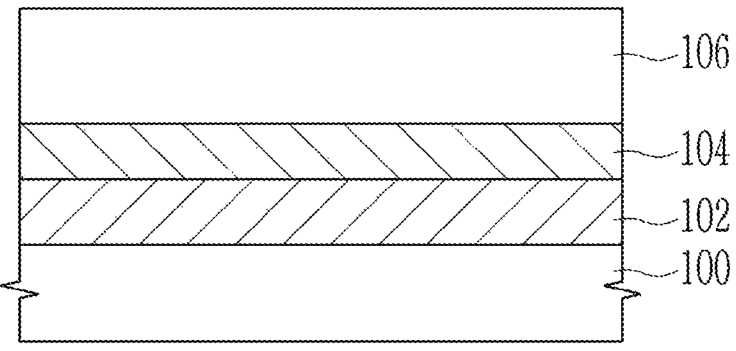

Referring to FIG. 2, the photoresist layer 106 is formed by coating the semiconductor photoresist composition on the resist underlayer 104. The photoresist layer 106 is obtained by coating the aforementioned semiconductor photoresist composition on the thin film 102 formed on the substrate 100 and then, curing it through a heat treatment.

In some embodiments, the formation of a pattern by utilizing the semiconductor photoresist composition may include coating the semiconductor photoresist composition on the substrate 100 having the thin film 102 through spin coating, slit coating, inkjet printing, and/or the like and then, drying it to form the photoresist layer 106.

The semiconductor photoresist composition has already been described in more detail and will not be repeated again.

Subsequently, a substrate 100 having the photoresist layer 106 is subjected to a first baking process. The first baking process may be performed at about 80° C. to about 120° C.

Figure 3:
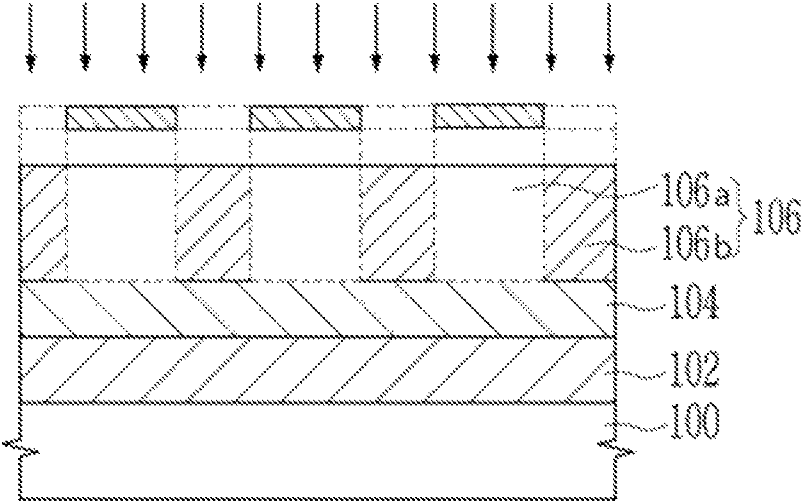

Referring to FIG. 3, the photoresist layer 106 may be selectively exposed.

In some embodiments, the exposure may utilize an activation radiation with light having a high energy wavelength such as EUV (extreme ultraviolet; a wavelength of 13.5 nm), an E-Beam (an electron beam), and/or the like as well as a short wavelength such as an i-line (a wavelength of 365 nm), a KrF excimer laser (a wavelength of 248 nm), an ArF excimer laser (a wavelength of 193 nm), and/or the like.

In some embodiments, light for the exposure according to an embodiment may have a short wavelength in a range of about 5 nm to about 150 nm and high energy, for example, EUV (extreme ultraviolet; a wavelength of 13.5 nm), an E-Beam (an electron beam), and/or the like.

The exposed region 106*b* of the photoresist layer 106 has a different solubility from the non-exposed region 106*a* of the photoresist layer 106 by forming a polymer by a cross-linking reaction such as condensation between organometallic compounds.

Subsequently, the substrate 100 is subjected to a second baking process. The second baking process may be performed at a temperature of about 90° C. to about 200° C. The exposed region 106*b* of the photoresist layer 106 becomes (e.g., easily becomes) indissoluble (e.g., insoluble) regarding a developing solution due to the second baking process.

Figure 4:
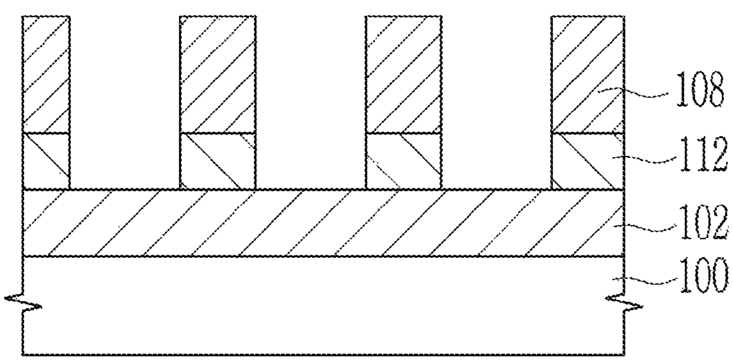

In FIG. 4, the non-exposed region 106*a* of the photoresist layer is dissolved and removed utilizing the developing solution to form a photoresist pattern 108. In some embodiments, the non-exposed region 106*a* of the photoresist layer is dissolved and removed by utilizing an organic solvent such as 2-heptanone and/or the like to complete the photoresist pattern 108 corresponding to the negative tone image.

As described above, a developing solution utilized in a method of forming patterns according to an embodiment may be an organic solvent. The organic solvent utilized in the method of forming patterns according to an embodiment may be, for example, one or more ketones such as methylethylketone, acetone, cyclohexanone, 2-heptanone, and/or the like, alcohols such as 4-methyl-2-propanol, 1-butanol, isopropanol, 1-propanol, methanol, and/or the like, esters such as propylene glycol monomethyl ether acetate, ethyl acetate, ethyl lactate, n-butyl acetate, butyrolactone, and/or the like, aromatic compounds such as benzene, xylene, toluene, and/or the like, or a combination thereof.

However, the photoresist pattern according to an embodiment is not necessarily limited to the negative tone image but may be formed to have a positive tone image. Herein, a developer utilized for forming the positive tone image may be a quaternary ammonium hydroxide composition such as tetraethylammonium hydroxide, tetrapropylammonium hydroxide, tetrabutylammonium hydroxide, or a combination thereof.

As described above, exposure to light having a high energy such as EUV (extreme ultraViolet; a wavelength of 13.5 nm), an E-Beam (an electron beam), and/or the like as well as light having a wavelength such as i-line (wavelength of 365 nm), KrF excimer laser (wavelength of 248 nm), ArF excimer laser (wavelength of 193 nm), and/or the like may provide a photoresist pattern 108 having a width of about 5 nm to about 100 nm. For example, the photoresist pattern 108 may have a width (e.g., a width of a thickness) of about 5 nm to about 90 nm, about 5 nm to about 80 nm, about 5 nm to about 70 nm, about 5 nm to about 60 nm, about 5 nm to about 50 nm, about 5 nm to about 40 nm, about 5 nm to about 30 nm, or about 5 nm to about 20 nm.

On the other hand, the photoresist pattern 108 may have a pitch with a half-pitch of less than or equal to about 50 nm, for example, less than or equal to about 40 nm, for example, less than or equal to about 30 nm, for example, less than or equal to about 20 nm, or for example, less than or equal to about 15 nm, and a line width roughness of less than or equal to about 10 nm, less than or equal to about 5 nm, less than or equal to about 3 nm, or less than or equal to about 2 nm.

Subsequently, the photoresist pattern 108 is utilized as an etching mask to etch the resist underlayer 104. Through this etching process, an organic layer pattern 112 is formed. The organic layer pattern 112 also may have a width corresponding to that of the photoresist pattern 108.

Figure 5:
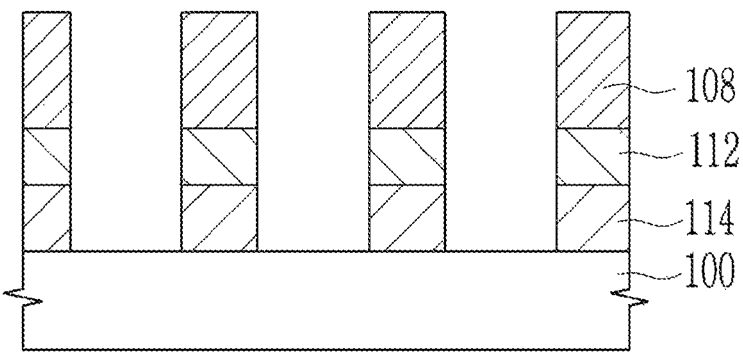

Referring to FIG. 5, the exposed thin film 102 is etched by applying the photoresist pattern 108 as an etching mask. As a result, the thin film is formed as a thin film pattern 114.

The etching of the thin film 102 may be, for example, dry etching utilizing an etching gas and the etching gas may be, for example, $CHF_3$, $CF_4$, $Cl_2$, $BCl_3$, or a mixed gas thereof.

In the exposure process performed above, the thin film pattern 114 formed by utilizing the photoresist pattern 108 (formed through the exposure process performed by utilizing an EUV light source) may have a width corresponding to that of the photoresist pattern 108. For example, the thin film pattern 114 may have a width of about 5 nm to about 100 nm, which is equal or substantially equal to that of the photoresist pattern 108. In some embodiments, the thin film pattern 114 formed by utilizing the photoresist pattern 108 (formed through the exposure process performed by utilizing an EUV light source) may have a width of about 5 nm to about 90 nm, about 5 nm to about 80 nm, about 5 nm to about 70 nm, about 5 nm to about 60 nm, about 5 nm to about 50 nm, about 5 nm to about 40 nm, about 5 nm to about 30 nm, or about 5 nm to about 20 nm. In an embodiment, the thin film pattern 114 formed by utilizing the photoresist pattern 108 may have a width of less than or equal to about 20 nm, similar to that of the photoresist pattern 108.

Hereinafter, the present disclosure will be described in more detail through examples of the preparation of the aforementioned semiconductor photoresist composition. However, the present disclosure is (e.g., technically) not restricted by the following examples.

EXAMPLES

Synthesis Example 1: Synthesis of First Organometallic Compound

In a 250 mL 2-necked round-bottomed flask, 20 g (51.9 mmol) of $Ph_3SnCl$ was dissolved in 70 mL of THF and then, cooled to 0° C. in an ice bath. Subsequently, a butyl magnesium chloride (BuMgCl) solution 1 M in THF (62.3 mmol) was slowly added thereto in a dropwise fashion. When the addition in a dropwise fashion was completed, the obtained mixture was stirred at 25° C. for 12 hours, obtaining a compound represented by Chemical Formula 7a.

The compound represented by Chemical Formula 7a (10 g, 24.6 mmol) was dissolved in 50 mL of $CH_2Cl_2$, and 3 equivalents (73.7 mmol) of a 2 M HCl diethyl ether solution was slowly added thereto in a dropwise fashion at −78° C. for 30 minutes. Subsequently, after stirring the obtained mixture at 25° C. for 12 hours, a solvent was concentrated and distilled under vacuum, obtaining a compound represented by Chemical Formula 7b.

Subsequently, 25 mL of acetic acid was added dropwise to 10 g (25.6 mmol) of the compound of Chemical Formula 7b at 25° C. and then, heated under reflux for 12 hours. At the temperature of 25° C., the acetic acid was distilled under vacuum, finally obtaining a compound represented by Chemical Formula 7.

Chemical Formula 7a

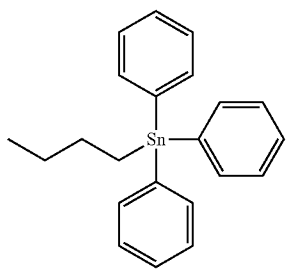

Chemical Formula 7b

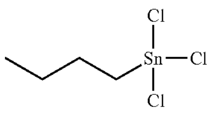

Chemical Formula 7c

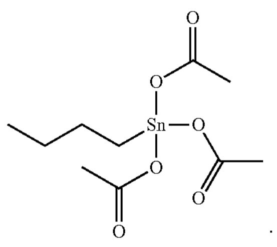

Synthesis Example 2: Synthesis of Second Organometallic Compound

In a 500 mL 2-necked round-bottomed flask, 5 g (218 mmol) of Na washed with n-hexane on the surface was dissolved in 120 mL of toluene and then, cooled to −20° C. in an ice bath, and 50 g (240 mmol) of hexafluoroacetone was slowly added thereto in a dropwise fashion. When the addition in a dropwise fashion was completed, the mixture was slowly heated to 25° C. and refluxed for 6 hours. Subsequently, after decreasing the temperature to −10° C. in an ice bath again, a solution prepared by dissolving 13.8 g (72.7 mmol) of $SnCl_2$ in 100 mL of toluene in another 250 mL flask was slowly added thereto in a dropwise fashion.

Subsequently, after increasing the temperature to 25° C. and refluxing the mixture for 6 hours, the resultant was treated with a fritted filter to remove precipitates generated in the solvent and then, concentrated and purified, obtaining a compound represented by Chemical Formula 8.

Chemical Formula 8

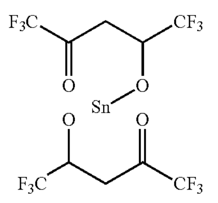

Examples 1 to 5 and Comparative Example 1: Preparation of Semiconductor Photoresist Compositions Each semiconductor photoresist composition was prepared by dissolving the compound represented by Chemical Formula 7 according to Synthesis Example 1 and the compound represented by Chemical Formula 8 in Synthesis Example 2 in a weight ratio shown in Table 1 in 1-methyl-2-propyl acetate at a concentration of 3 wt % and then, filtering the solution with a 0.1 μm PTFE (polytetrafluoroethylene) syringe filter.

Formation of Photoresist Layers

A 4-inch circular silicon wafer with a native-oxide surface was utilized as a substrate for depositing a thin film. The silicon wafer was treated in a UV ozone cleaning system for 10 minutes before depositing the thin film. On the treated substrate, the semiconductor photoresist compositions according to Examples 1 to 5 and Comparative Example 1 were respectively spin-coated at 1500 rpm for 30 seconds and baked at 100° C. for 120 seconds (post-apply baked, PAB), thereby forming a thin film.

Subsequently, when the film was measured for thickness after the coating and the baking through ellipsometry, the result was 25 nm. That is, each of the thin film has a thickness of 25 nm.

TABLE 1

| | Composition | |
|---|---|---|
| | First organometallic compound (parts by weight) | Second organometallic compound (parts by weight) |
| Example 1 | Chemical Formula 7 (100) | Chemical Formula 8 (10) |
| Example 2 | Chemical Formula 7 (100) | Chemical Formula 8 (20) |
| Example 3 | Chemical Formula 7 (100) | Chemical Formula 8 (30) |
| Example 4 | Chemical Formula 7 (100) | Chemical Formula 8 (40) |
| Example 5 | Chemical Formula 7 (100) | Chemical Formula 8 (50) |
| Comparative Example 1 | Chemical Formula 7 (100) | — |

Evaluation: Evaluation of Sensitivity and Line Edge Roughness (LER)

A linear array of 50 circular pads each having a diameter of 500 μm was projected onto a wafer coated with each photoresist composition according to Examples 1 to 5 and Comparative Example 1 by utilizing EUV light (Lawrence Berkeley National Laboratory Micro Exposure Tool, MET). Herein, pad exposure time was adjusted to apply an increased EUV dose to each pad.

Subsequently, the resist and the substrate were placed (e.g., exposed) on a hot plate at 160° C. for 120 seconds for post-exposure baking (PEB). The baked films were respectively dipped in a developing solution (2-heptanone) for 30 seconds and additionally washed with the same developer for 10 seconds, forming negative tone images, that is, removing non-exposed coating regions. Finally, the films were respectively baked on the hot plate at 150° C. for 2 minutes, completing a process.

Then, an ellipsometer was utilized to measure a residual resist thickness of the exposed pads. The residual resist thicknesses for each exposure dose were measured and graphed as a function of the exposure doses, thereby obtaining Dg (energy level at which the development was completed) for each resist composition, shown as sensitivity in Table 2.

After measuring the line edge roughness (LER) of the formed line confirmed from the FE-SEM image, it is shown in Table 2.

TABLE 2

| | Sensitivity (μC/cm²) | LER (nm) |
|---|---|---|
| Example 1 | 980 | 3.9 |
| Example 2 | 920 | 3.7 |
| Example 3 | 700 | 3.8 |
| Example 4 | 520 | 3.9 |
| Example 5 | 310 | 4.0 |
| Comparative Example 1 | 1,500 | 3.9 |

Referring to the results of Table 2, the patterns formed of the photoresist compositions for a semiconductor according to Examples 1 to 5 had excellent or suitable sensitivity without much increase in line edge roughness, compared with the pattern formed of the composition for a semiconductor according to Comparative Example 1.

As used herein, the term "and/or" includes any and all combinations of one or more of the associated listed items. Throughout the disclosure, the expression, such as "at least one of a, b or c", "at least one selected from a, b, and c", "at least one selected from the group consisting of a, b, and c", etc., indicates only a, only b, only c, both (e.g., simultaneously) a and b, both (e.g., simultaneously) a and c, both (e.g., simultaneously) b and c, all of a, b, and c, or variation(s) thereof.

The use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The electronic apparatus, the display device, and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

Hereinbefore, certain embodiments of the present disclosure have been described and illustrated, however, it is apparent to a person with ordinary skill in the art that the present disclosure is not limited to the embodiment as described, and may be variously modified and transformed without departing from the spirit and scope of the present disclosure. Accordingly, the modified or transformed embodiments as such may not be understood separately from the technical ideas and aspects of the present disclosure, and the modified embodiments are within the scope of the claims of the present disclosure, and equivalents thereof.

DESCRIPTION OF SYMBOLS

| |
|---|
| 100: substrate |
| 102: thin film |
| 104: resist underlayer |
| 106: photoresist layer |
| 106a: non-exposed region |
| 106b: exposed region |
| 108: photoresist pattern |
| 112: organic layer pattern |
| 114: thin film pattern |

What is claimed is:

1. A photoresist composition, comprising
a first organometallic compound comprising a metal selected from Sn, Sb, In, Bi, Zr, and Hf;
a second organometallic compound represented by Chemical Formula 1; and
a solvent:

Chemical Formula 1

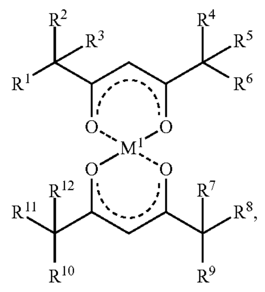

wherein, in Chemical Formula 1, $M^1$ is a metal selected from Sn, Sb, and Te, and $R^1$ to $R^{12}$ are each independently hydrogen, a halogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

2. The photoresist composition of claim 1, wherein the first organometallic compound comprises:

a metal-carbon bond; and at least one substituent forming a hydrolyzable bond with the metal.

3. The photoresist composition of claim 2, wherein the substituent forming the hydrolyzable bond with the metal is selected from:

an amino group represented by $—NR^aR^b$, wherein $R^a$ and $R^b$ are each independently hydrogen or a C1 to C30 hydrocarbon group, a silyloxo group represented by $—OSiR^aR^bR^c$, wherein $R^a$, $R^b$, and $R^c$ are each independently a C1 to C30 hydrocarbon group, a silylamino group represented by $(—N(SiR^a{}_3)(R^b)$, wherein $R^a$ and $R^b$ are each independently a C1 to C30 hydrocarbon group, a disilylamino group represented by $—N(SiR^a{}_3)(SiR^b{}_3)$, wherein $R^a$ and $R^b$ are each independently a C1 to C30 hydrocarbon group, an alkoxo group and an aryloxo group represented by $—OR^a$, wherein $R^a$ is a C1 to C30 alkyl group or an aryl group, a carboxyl group represented by $—O(COR^a)$, wherein $R^a$ is hydrogen or a C1 to C30 hydrocarbon group, an azido group $(—N_3)$, an alkyne group represented by $—C{\equiv}CR^a$, wherein $R^a$ is a C1 to C30 hydrocarbon group, an amido group represented by $—NR^a(COR^b)$, wherein $R^a$ and $R^b$ are each independently hydrogen or a C1 to C30 hydrocarbon group, an amidinato group represented by $—NR^aC(NR^b)R^c$, wherein $R^a$, $R^b$, and $R^c$ are each independently hydrogen or a C1 to C30 hydrocarbon group, an imido group represented by $—N(COR^a)(COR^b)$, wherein $R^a$ and $R^b$ are each independently hydrogen or a C1 to C30 hydrocarbon group, and combinations thereof.

4. The photoresist composition of claim 1, wherein the first organometallic compound is represented by Chemical Formula 2a:

Chemical Formula 2a

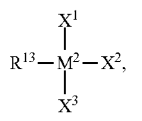

wherein, in Chemical Formula 2a:

$M^2$ is a metal selected from Sn, Sb, In, Bi, Zr, and Hf, $R^{13}$ is selected from a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C7 to C31 arylalkyl group, and $-L^a-O—R^d$, wherein $L^a$ is a substituted or unsubstituted C1 to C20 alkylene group and $R^d$ is a substituted or unsubstituted C1 to C20 alkyl group, $X^1$ to $X^3$ are each independently selected from $—N_3$, $—NR^{14}R^{15}$, $—O(COR^{16}$, $—NR^{17}(COR^{18})$, $—NR^{19}C(NR^{20})R^{21}$, $—N(COR^{22})(COR^{23})$, $—OSiR^{24}R^{25}R^{26}$, $—N(SiR^{27}{}_3)(R^{28})—N(SiR^{29}{}_3)(SiR^{30}{}_3)$, $—OR^{31}$, and $—C{\equiv}CR^{32}$, $R^{14}$ to $R^{23}$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^{24}$ to $R^{32}$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

5. The photoresist composition of claim 4, wherein $X^1$ to $X^3$ are each independently $—O(COR^{16})$, or $—OR^{31}$, $R^{16}$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^{31}$ is each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

6. The photoresist composition of claim 4, wherein $M^2$ is Sn.

7. The photoresist composition of claim 6, wherein the first organometallic compound comprises at least one of compounds of Group 1:

Group 1

Chemical Formula 3

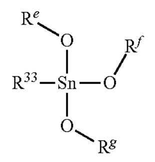

Chemical Formula 4

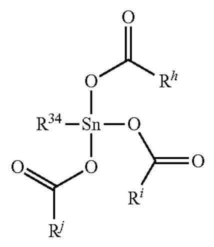

-continued

Chemical Formula 5

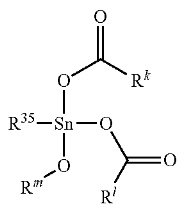

Chemical Formula 6

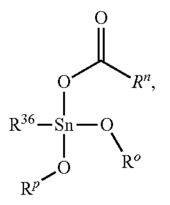

wherein, in Chemical Formula 3 to Chemical Formula 6, $R^{33}$ to $R^{36}$ are each independently a substituted or unsubstituted C1 to C20 alkyl group, a substituted or unsubstituted C3 to C20 cycloalkyl group, a substituted or unsubstituted C2 to C20 aliphatic unsaturated organic group comprising at least one double bond or triple bond, a substituted or unsubstituted C6 to C30 aryl group, an ethoxy group, a propoxy group, or a combination thereof, $R^e$, $R^f$, $R^g$, $R^m$, $R^o$, and $R^p$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^h$, $R^i$, $R^j$, $R^k$, $R^l$, and $R^n$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

8. The photoresist composition of claim 1, wherein the first organometallic compound is represented by Chemical Formula 2b:

Chemical Formula 2b

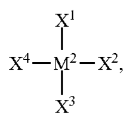

wherein, in Chemical Formula 2b, $M^2$ is a metal selected from Sn, Sb, In, Bi, Zr, and Hf, $X^1$ to $X^4$ are each independently selected from —$N_3$, —$NR^{14}R^{15}$, —$O(COR^{16})$, —$NR^{17}(COR^{18})$, —$NR^{19}C(NR^{20})R^{21}$, —$N(COR^{22})(COR^{23})$, —$OSiR^{24}R^{25}R^{26}$, —$N(SiR^{27}_3)(R^{28})$, —$N(SiR^{29}_3)(SiR^{30}_3)$, —$OR^{31}$, and —$C{\equiv}CR^{32}$, $R^{14}$ to $R^{23}$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^{24}$ to $R^{32}$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

9. The photoresist composition of claim 8, wherein $X^1$ to $X^4$ are each independently —$O(COR^{16})$, or —$OR^{31}$, $R^{16}$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^{31}$ is each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

10. The photoresist composition of claim 8, wherein $M^2$ is Sn.

11. The photoresist composition of claim 1, wherein the first organometallic compound is represented by Chemical Formula 2c:

Chemical Formula 2c

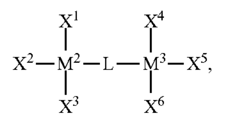

wherein, in Chemical Formula 2c, $M^2$ and $M^3$ are each independently a metal selected from Sn, Sb, In, Bi, Zr, and Hf, $X^1$ to $X^6$ are each independently selected from —$N_3$, —$NR^{14}R^{15}$, —$O(COR^{16})$, —$NR^{17}(COR^{18})$, —$NR^{19}C(NR^{20})R^{21}$, —$N(COR^{22})(COR^{23})$, —$OSiR^{24}R^{25}R^{26}$, —$N(SiR^{27}_3)(R^{28})$—$N(SiR^{29}_3)(SiR^{30}_3)$, —$OR^{31}$, and —$C{\equiv}CR^{32}$, $R^{14}$ to $R^{23}$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, $R^{24}$ to $R^{32}$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and L is a single bond, a substituted or unsubstituted divalent C1 to C20 saturated aliphatic hydrocarbon group, a substituted or unsubstituted divalent C3 to C20 saturated or unsaturated alicyclic hydrocarbon group, a substituted or unsubstituted divalent C2 to C20 unsaturated aliphatic hydrocarbon group comprising at least one double bond or triple bond, a substituted or unsubstituted divalent C6 to C20 aromatic hydrocarbon group, —O—, —C(═O)—, or a combination thereof.

12. The photoresist composition of claim 11, wherein $X^1$ to $X^4$ are each independently —O(COR$^{16}$) or —OR$^{31}$, $R^{16}$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^{31}$ is each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

13. The photoresist composition of claim 11, wherein $M^2$ and $M^3$ are each Sn.

14. The photoresist composition of claim 1, wherein at least one of $R^1$ to $R^{12}$ in Chemical Formula 1 is a halogen.

15. The photoresist composition of claim 1, wherein $R^1$ to $R^{12}$ in Chemical Formula 1 are each independently hydrogen, a halogen, a substituted or unsubstituted C1 to C10 alkyl group, a substituted or unsubstituted C3 to C10 cycloalkyl group, a substituted or unsubstituted C2 to C10 alkenyl group, a substituted or unsubstituted C2 to C20 alkynyl group, a substituted or unsubstituted C6 to C20 aryl group, or a combination thereof, and at least one of $R^1$ to $R^{12}$ is a halogen.

16. The photoresist composition of claim 1, wherein $R^1$ to $R^{12}$ in Chemical Formula 1 are each fluoro (—F).

17. The photoresist composition of claim 1, wherein the second organometallic compound is about 1 part to 50 parts by weight in amount based on 100 parts by weight of the first organometallic compound.

18. The photoresist composition of claim 1, wherein the second organometallic compound is about 1 part to 30 parts by weight in amount based on 100 parts by weight of the first organometallic compound.

19. The photoresist composition of claim 1, wherein based on 100 wt % of the photoresist composition, a total amount of the first organometallic compound and the second organometallic compound is about 0.5 wt % to about 30 wt %.

20. The photoresist composition of claim 1, wherein the photoresist composition further comprises an additive selected from a surfactant, a crosslinking agent, a leveling agent, and combinations thereof.

21. A method of forming patterns, the method comprising:

applying an etching-objective layer on a substrate;

coating the photoresist composition of claim 1 on the etching-objective layer to form a photoresist layer;

patterning the photoresist layer to form a photoresist pattern; and etching the etching-objective layer utilizing the photoresist pattern as an etching mask.

22. The method of claim 21, wherein the photoresist pattern is formed utilizing light in a wavelength of about 5 nm to about 150 nm.

23. The method of claim 21, further comprising:

applying a resist underlayer between the substrate and the photoresist layer.

24. The method of claim 21, wherein the photoresist pattern has a width of about 5 nm to about 100 nm.

* * * * *